United States Patent
Magarelli

(10) Patent No.: US 10,462,934 B2
(45) Date of Patent: Oct. 29, 2019

(54) PENTHOUSE COOLING/RETURN AIR DISTRIBUTION ASSEMBLY

(71) Applicant: Facebook, Inc., Menlo Park, CA (US)

(72) Inventor: Marco Magarelli, Sunnyvale, CA (US)

(73) Assignee: Facebook, Inc., Menlo Park, CA (US)

( * ) Notice: Subject to any disclaimer, the term of this patent is extended or adjusted under 35 U.S.C. 154(b) by 31 days.

(21) Appl. No.: 15/698,576

(22) Filed: Sep. 7, 2017

(65) Prior Publication Data

US 2019/0075684 A1    Mar. 7, 2019

(51) Int. Cl.
| | |
|---|---|
| H05K 7/20 | (2006.01) |
| B60H 1/00 | (2006.01) |
| F24F 13/06 | (2006.01) |
| F24F 13/062 | (2006.01) |

(52) U.S. Cl.
CPC ..... *H05K 7/20745* (2013.01); *B60H 1/00021* (2013.01); *F24F 13/06* (2013.01); *F24F 13/062* (2013.01); *H05K 7/20* (2013.01)

(58) Field of Classification Search
CPC .......... F24F 13/04; F24F 13/06; F24F 13/062; F24F 13/065; H05K 7/20; H05K 7/20745
USPC .................................. 165/80.2; 62/427, 259.2
See application file for complete search history.

(56) References Cited

U.S. PATENT DOCUMENTS

| | | | | |
|---|---|---|---|---|
| 9,485,887 | B1* | 11/2016 | Eichelberg | ........... H05K 7/1497 |
| 9,723,759 | B2* | 8/2017 | Heydari | ............. H05K 7/20836 |
| 2005/0056313 | A1* | 3/2005 | Hagen | .................. B01F 5/0453 137/3 |
| 2007/0062175 | A1* | 3/2007 | Yuan | ..................... F01D 25/305 60/39.182 |
| 2008/0318510 | A1* | 12/2008 | Shane | ................. B60H 1/3414 454/69 |
| 2009/0293518 | A1* | 12/2009 | Bettella | .................... F04D 25/12 62/186 |
| 2011/0083824 | A1* | 4/2011 | Rogers | ............... H05K 7/20745 165/80.2 |
| 2013/0043775 | A1* | 2/2013 | Chen | .................. H05K 7/20781 312/236 |
| 2018/0077819 | A1* | 3/2018 | Roy | .................... H05K 7/20181 |

\* cited by examiner

*Primary Examiner* — Paul Alvare
(74) *Attorney, Agent, or Firm* — FisherBroyles, LLP

(57) ABSTRACT

A cooling air distribution assembly with a housing having an interior area, and spaced-apart trailing edge portions defining an airflow opening in communication with an interior area. An airflow damper positioned within the housing is moveable relative to the airflow opening to control heated airflow from the interior area. Deflectors on opposing sides of the housing define a mixing area adjacent to the airflow opening. The deflectors have leading ends spaced apart from the housing to define air inlets that receive a cooling airflow into the mixing area. Trailing end portions of the deflectors define a mixed air outlet adjacent to the mixing area. The airflow damper is adjustable relative to the housing to control a temperature of the mixture of the cooling airflow and a portion of the flow of heated air passing through the mixed air outlet.

20 Claims, 7 Drawing Sheets

US 10,462,934 B2

PENTHOUSE COOLING/RETURN AIR DISTRIBUTION ASSEMBLY

TECHNICAL FIELD

This patent application is directed to penthouse cooling systems for server rooms, and more specifically to controllable return air assemblies for use with penthouse cooling systems for server rooms.

BACKGROUND

A conventional "penthouse" cooling system uses the upper floor of the data center building as a large cooling plenum with multiple chambers for cooling, filtering and directing the fresh air used to cool the data center. A "penthouse" area is built above a data server room which contains many data servers, each of which generates heat during operation. The servers must be cooled for optimum performance. In the conventional penthouse cooling system, cool air enters the server room from the overhead penthouse area using the natural tendency for cold air to fall and hot air to rise. This eliminates the need to use air pressure to force cool air up through a raised floor. The cool air passes through a series of air filters and one or more misting chambers where a fine spray is applied to further control the temperature and humidity. The air continues through another filter to absorb the mist, and then through a fan wall that pushes the air through openings in the floor that serve as an air shaft leading into the server area. The temperature and flow of cooling air through the airshafts, however, can be difficult to control for a desired airflow temperature provided to the server room. The cooling system, including the fans in the fan wall, can create elevated noise conditions in the server room, as well as outside the server room and outside the data center. Accordingly, there is a need for an improved airflow system configurable for use with a penthouse cooling system for a data server room.

BRIEF DESCRIPTION OF THE DRAWINGS

Embodiments of the cooling systems and air distribution assemblies disclosed herein may be better understood by referring to the following Detailed Description in conjunction with the accompanying drawings, in which like reference numerals indicate identical or functionally similar elements.

Figure 1:
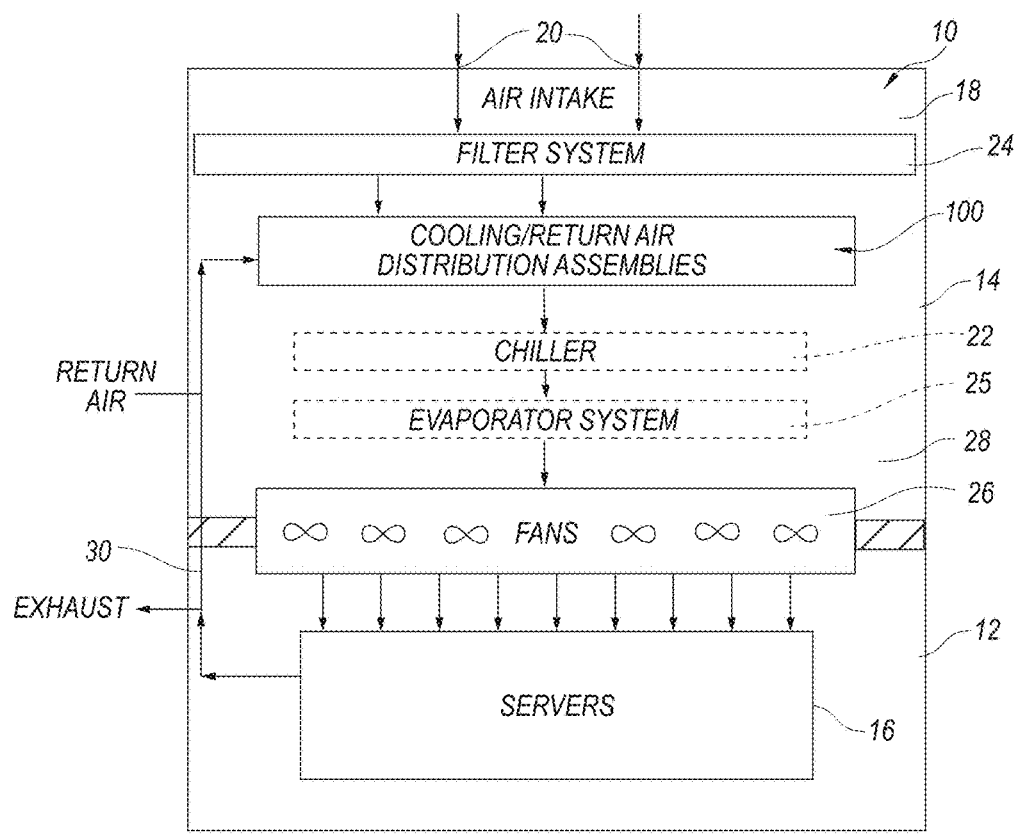
FIG. 1 is a schematic of a penthouse cooling system for a server room in a data center, wherein cooling/return air distribution assemblies in accordance with one or more embodiments of the present technology direct mixed cooling air into the server room.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

An aspect of the present disclosure provides a cooling/return air distribution assembly usable with a "penthouse" cooling system to mix fresh cooling air with heated return air to control the temperature of the airflow through an airflow chamber and into the server room of a data center. The penthouse cooling system has an upper chamber "penthouse" above a server room that houses equipment and chambers used to cool, filter, and direct fresh air into a server room to cool the servers operating in the server room. The cooled, mixed, and humidity-controlled air is directed down from the penthouse airflow chamber toward rows or cabinets of servers. The air distribution assemblies can include a chamfered or contoured interior air duct assembly with a damper adjacent to perforated deflectors to control and direct the mixed, temperature controlled air along the airflow path for delivery into the server room. The damper in the contoured interior air duct assembly can be rotated to control the volume and speed of the airflow. The perforated deflectors create turbulence and absorb sound to reduce the noise from air distribution fans that move air in the data center environment.

In at least one embodiment of the present technology, an air distribution assembly is provided that comprises an interior air duct assembly having a housing with a leading edge portion and spaced apart trailing edge portions defining an airflow opening in communication with an interior area in the housing. The housing is couplable to a return air duct system that carries heated return air away from the server room. The interior air duct assembly has an airflow damper positioned within the housing, and the damper is moveable relative to the airflow opening to control a flow of the heated return air out of the interior area through the airflow opening. Deflectors are positioned on opposing sides of the housing and define a mixing area between the deflectors and adjacent to the airflow opening. The deflectors have leading end portions spaced apart from the housing to define air inlets configured to receive an airflow around a portion of the housing and into the mixing area. The deflectors have trailing end portions spaced apart from each other and define a mixed air outlet in communication with the mixing area. The deflectors are configured to direct a mixture of the airflow and a portion of the flow of heated air away from the mixed air outlet. The airflow damper is adjustable relative to the housing to control a temperature of the mixture of the airflow and a portion of the flow of heated air passing through the mixed air outlet.

Another embodiment provides an air distribution assembly for use with a server room cooling system. The assembly comprises an adjustable return air duct assembly configured to receive heated return air from, as an example, a server room. The return air duct assembly has a tubular housing with a leading edge portion connected to sidewalls with trailing edge portions spaced apart from each other. The trailing edge portions define a return air opening in communication with an interior area configured to carry the heated return air. An airflow damper is positioned within the housing and is moveable relative to the return air opening to block at least a portion of the return air opening and control a flow of the heated return air from the interior area through the return air opening. A pair of spaced apart, arcuate cooling air deflectors is positioned on opposing sides of the housing and define a mixing area between the deflectors and adjacent to the return air opening. The deflectors have leading end portions spaced apart from the sidewalls of the housing to define cooling air inlets configured to receive cooled air from the server room cooling system that flows around the leading edge portion of the housing and to direct the cooled air into the mixing area. The cooling air deflectors have trailing end portions spaced apart from each other and define a mixed air outlet in communication with the mixing area. The deflectors are configured to direct a mixture of the cooled air and the heated return air away from the air distribution assembly. The airflow damper is adjustable relative to the housing to control a temperature of the mixture of the cooled air and the heated return air directed along the airflow path for delivery into, for example, a server room.

Another embodiment provides an air distribution assembly for use with a server room cooling system. The assembly comprises an adjustable return air duct assembly configured to receive heated return air from a server room, wherein the return air duct assembly has an elongated housing with a closed leading edge portion. The housing has arcuate sidewalls with spaced apart trailing edge portions defining a return air opening opposite the closed leading edge portion and in communication with an interior area through which the heated return air from the server room can flow. The return air duct assembly has an airflow damper concentrically positioned within the housing and moveable relative to the return air opening to partially or fully block the return air opening and control a heated return airflow out of the housing through the return air opening. A pair of spaced apart, arcuate cooling air deflectors are positioned on opposing sides of the housing and define a mixing area between the deflectors and adjacent to the return air opening. The cooling air deflectors have leading end portions spaced apart from the sidewalls to define air inlets configured to receive cooled air flowing around the leading edge portion of the housing and to direct the cooled air into the mixing area to mix with the heated return airflow exiting the housing through the return air opening. The cooling air deflectors have a pair of spaced apart trailing end portions defining a mixed air outlet in communication with the mixing area and configured to direct a mixture of the cooled air and the heated return air away from the air distribution assembly. The airflow damper is adjustable relative to the housing to control the amount of heated return air entering the mixing area to mix with the cooled air to control a temperature of the mixture of the cooled air and the heated return air directed along the airflow path for delivery into a selected location, such as a server room.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description. The terminology used below is to be interpreted in its broadest reasonable manner, even though it is being used in conjunction with a detailed description of some specific examples of the embodiments.

FIG. 1 is a schematic of a penthouse cooling system 10 for a server room 12 in a data center building 14, wherein air distribution assemblies 100 in accordance with one or more embodiments of the present technology direct mixed, temperature-controlled air along the airflow path for delivery into the server room 12 to cool servers 16. While the air distribution assemblies 100 are discussed in connection with the penthouse cooling system 10 for a server room 12 for purposes of discussion, the air distribution assemblies 100 could be used with other airflow systems that receive and mix air flows and distribute the mixed airflows toward a selected area.

The illustrated penthouse cooling system 10 is provided in an upper floor 28 of the data center building 14, such that the upper floor 28 acts as a large cooling plenum 18 with multiple chambers for mixing, cooling, filtering and directing the fresh air used to cool the server room 12 and servers 16 in the data center 14. Ambient fresh air is received in the plenum 18 from an air intake 20, and the fresh air may be passed through a filter system 24 to remove unwanted external particulates. The ambient air flows through a bank of the air distribution assemblies 100, wherein the filtered, ambient air may be combined and mixed with heated return air from the server room 12 to control the temperature and flow of air from the air distribution assemblies 100. The flow of temperature-controlled, mixed air from the air distribution assemblies 100 can be directed through a chiller 22 and/or an evaporator system 25 in the penthouse cooling system 10 if the internal or external conditions require additional conditioning or humidity control of the cooling airflow before entering the server room 12. A plurality of fans 26 are downstream of the air distribution assemblies 100 and can be used to draw the airflow toward the fans and to push the temperature controlled and/or conditioned air from the cooling plenum 18 and into the server room 12.

The temperature controlled, conditioned air flows into the server room 12 to cool the servers 16, wherein the air draws heat from the servers 16. The resulting heated air, referred to as return air, is then drawn out of the server room 12 via exhaust ducting 30, which directs at least a portion of the heated return air through an exhaust outlet 32 and out of the data center 14. As discussed in greater detail below, the exhaust ducting 30 is coupled to the air distribution assemblies 100 to provide heated airflow that can be mixed with the filtered, fresh ambient intake air before the mixed airflow is directed into the server room 12, such that the airflow from the air distribution assemblies 100 is at a selected temperature before being directed into the server room 12. For example, when the external temperature of the ambient air entering the air intake 20 is below a desired temperature, the heat from the exhaust air can be used in the air distribution assemblies 100 to control the air temperature flowing from the air distribution assemblies 100 toward the server room 12.

Figure 2:
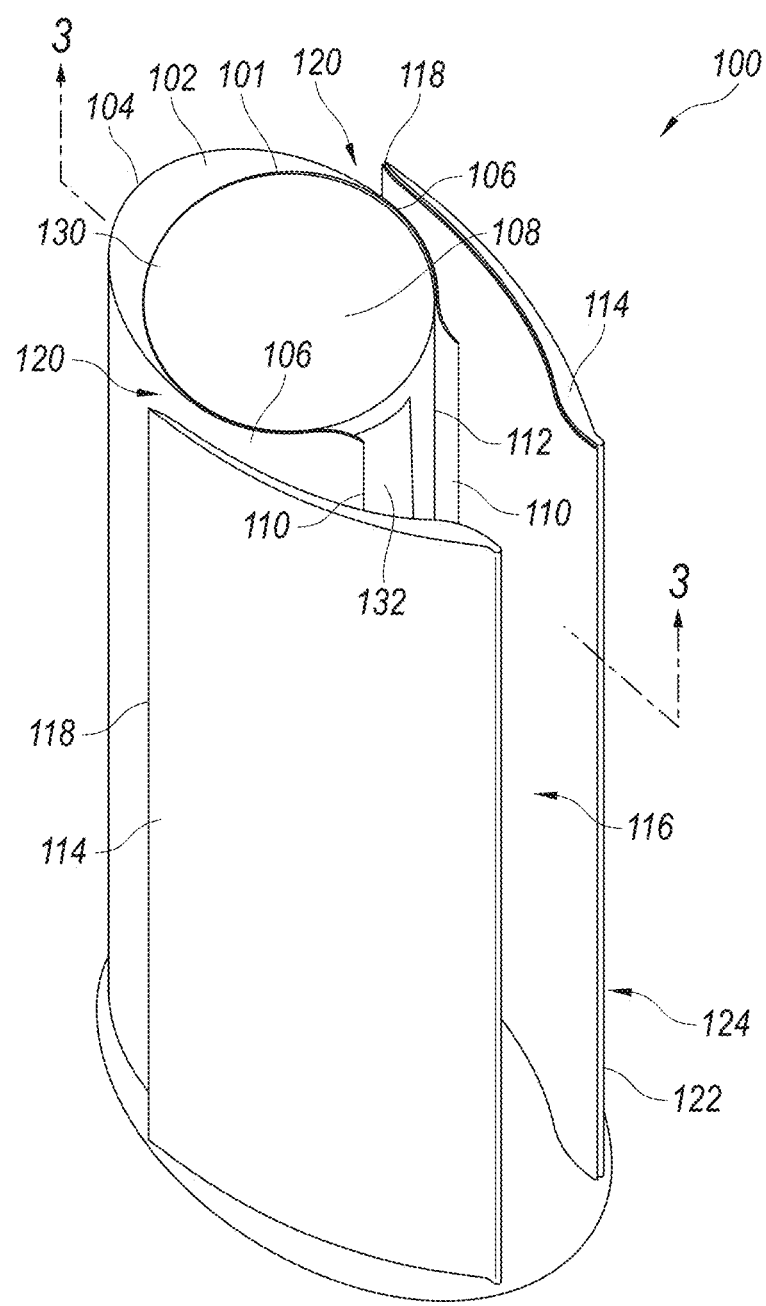
FIG. 2 is an isometric view of an air distribution assembly in accordance with aspects of the present disclosure.
Figure 3:
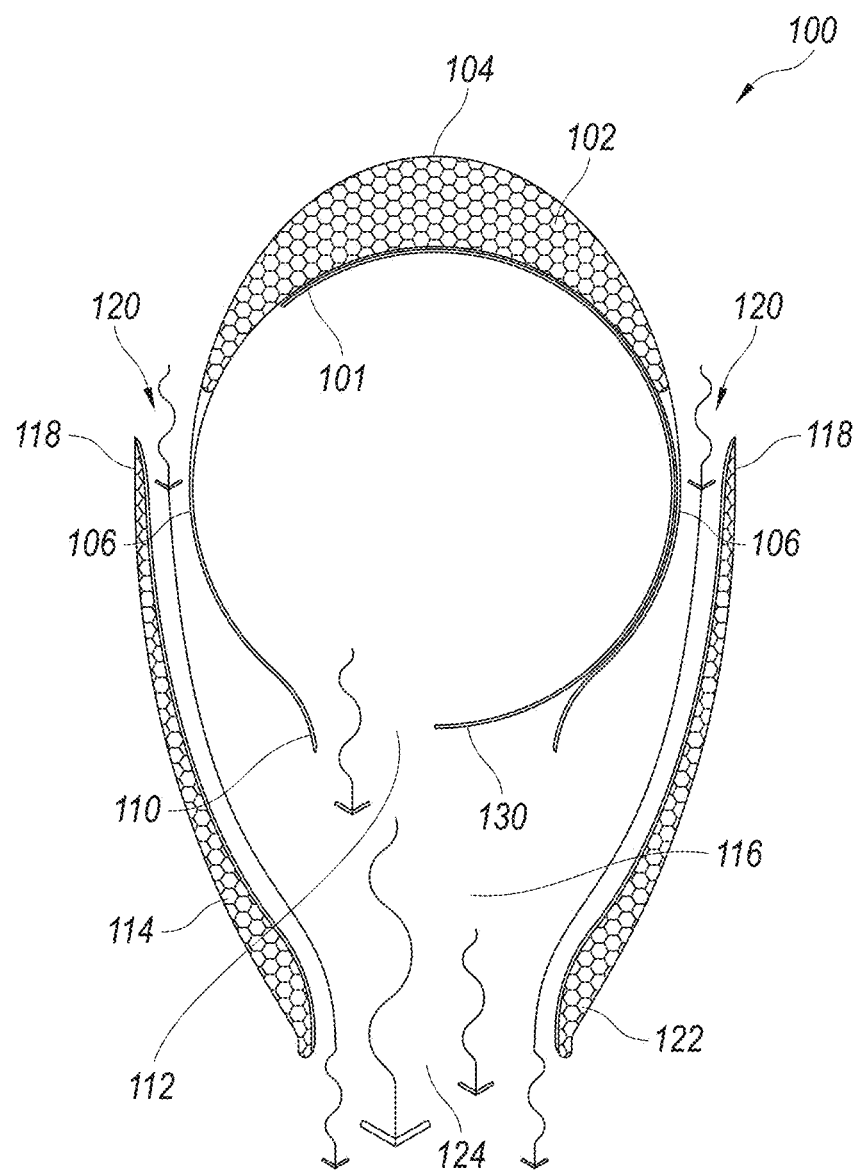
FIG. 3 is a cross-sectional view taken substantially along line 3-3 of FIG. 2 of the air distribution assembly.

FIG. 2 is an isometric view of an air distribution assembly 100, and FIG. 3 is a cross-sectional view taken substantially along line 3-3 of FIG. 2 of the air distribution assembly 100.

The air distribution assembly 100 of the illustrated embodiment has a return air duct assembly 101 with an elongated housing 102 with a closed leading edge portion 104 configured to face toward the flow of ambient air drawn into the plenum 18 by the fans 26 (FIG. 1). The housing 102 has a pair of arcuate sidewalls 106 connected to the leading edge portion 104 and configured to define an interior area 108 defining an airflow duct couplable to the exhaust ducting 30 (FIG. 1) to receive a flow of the heated return air from the server room 12 (FIG. 1). In the illustrated embodiment, the sidewalls 106 are integrally attached to the leading edge portion 104 and are curved to define an elongated, substantially cylindrical interior area 108. The housing 102, however, can have other shapes in other embodiments.

The leading edge portion 104 is the impingement surface that faces toward the air intake 20 and the filter system 24 and upon which the flow of ambient air initially impacts and flows around. In the illustrated embodiment, at least the leading edge portion 104 of the housing 102 has a noise abatement construction to help absorb and reduce fan and/or airflow noise from the penthouse cooling system 10 outside of the data center 14, as well as within the server room 12 (FIG. 1). For example, the leading edge portion 104 of the housing 102 can have a generally perforated construction that helps attenuate and reduce the noise. In another embodiment, the leading edge portion 104 may have a honeycomb-type construction configured to absorb noise to reduce the amount of noise propagated from the cooling system 10 to outside of the data center 14 (FIG. 1). In other embodiments, the housing can have other constructions to help reduce noise from the cooling system 10 (FIG. 1).

The arcuate sidewalls 106 have spaced apart trailing edge portions 110 defining a return air opening 112 opposite the closed leading edge portion 104 and in communication with an interior area 108 through which the heated return air from the server room flows. The trailing edge portions 110 of the sidewalls 106 of the illustrated embodiment are chamfered or flared radially generally away from the return air opening 112 so as to provide a trailing edge shape that causes at least partially turbulent airflow of a portion of the heated return air out of the housing 102 through the return air opening 112.

The air distribution assembly 100 also has a pair of spaced apart, arcuate cooling air deflectors 114 positioned on opposing sides of the housing 102 and adjacent to the sidewalls 106. The spaced apart deflectors 114 define a mixing area 116 between the deflectors and adjacent to the return air opening 112. The cooling air deflectors 114 each have a leading end portion 118 spaced apart from a respective one of the housing's sidewalls 106 to define air inlets 120. These air inlets receive the cooled and/or ambient air flowing around the leading edge portion 104 and along the sidewalls 106 of the housing 102, and direct the ambient air into the mixing area 116 to mix with the heated, turbulent return airflow exiting the housing's interior area 108 through the return air opening 112.

The deflectors 114 of the illustrated embodiment each have a contoured trailing end portion 122 spaced apart from the other deflector's trailing end portion 124 so as to define a mixed air outlet 124 in communication with the mixing area 116 and configured to direct a mixture of the ambient air and the heated return air away from the air distribution assembly 100 and into the server room 12 (FIG. 1).

The trailing end portions 122 of the deflectors 114 can also be chamfered or flared radially generally away from the mixed air outlet 124 so as to provide a trailing end shape that helps cause or increase a turbulent airflow of the air mixture flowing from the mixing area 116 and toward the server room 12 (FIG. 1). The deflectors can have different shapes in other embodiments to help control conditions of the mixed airflow from the air distribution assembly 100. In the illustrated embodiment, the deflectors 114 also have a noise abating construction to help absorb and reduce fan and/or airflow noise propagating out of the plenum 18 and the data center 14 (FIG. 1). For example, all or portions of the deflectors 114 can have a generally perforated construction that helps attenuate and reduce the noise. In another embodiment, the deflectors may have a honeycomb-type construction configured to absorb noise to reduce the amount of noise propagating from the penthouse cooling system 10. In other embodiments, the deflectors 114 can have other constructions to help reduce noise levels.

The air distribution assembly 100 is configured to help control the temperature of the air mixture exiting the mixed air outlet 124 and flowing toward the server room 12 (FIG. 1), by controlling the amount of heated return air allowed to enter the mixing area and mix with the ambient air. The return air duct assembly 101 has an adjustable airflow damper 130 movably positioned within the housing's interior area 108 and moveable relative to the return air opening 112 to partially or fully block the return air opening 112 and control the amount of heated return air flowing into the mixing area 116 to mix with the ambient air. The position of the airflow damper 130 relative to the housing 102 can be adjusted manually or automatically using a conventional rotary drive motor connected to the airflow damper and activatable to rotate the damper 130. Accordingly, the damper 130 can be adjusted to control the mixture of the airflow, thereby using the heat from the return air to closely control the temperature of the mixed airflow that will be directed into the server room 12 to cool the servers 16 (FIG. 1).

Figure 4A:
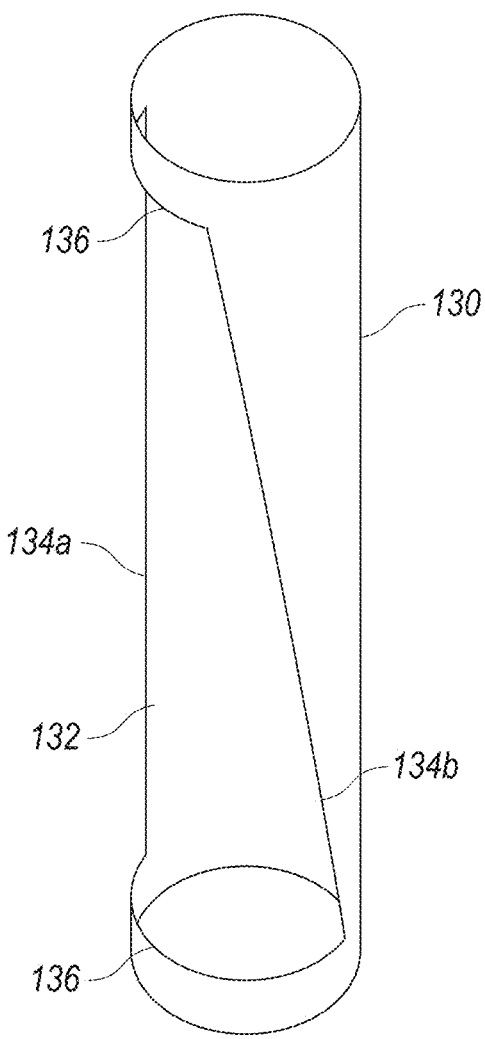
FIG. 4A is an isometric view of an airflow damper shown removed from the air distribution assembly of FIG. 2.

FIG. 4A is an isometric view of the airflow damper 130 shown removed from the housing 102. As seen in FIGS. 3 and 4A, the flow damper 130 of the illustrated embodiment is a substantially cylindrical tube coaxially aligned and concentrically positioned within the cylindrical interior area 108 of the housing (FIG. 3). The outer diameter of the damper 130 is slightly less than the inner diameter of the housing 102, such that the damper 130 can rotate about its longitudinal axis and rotate relative to the return air opening 112 (FIG. 3). The cylindrical damper 130 has an enlarged damper opening 132 in a wall 134 of the cylindrical damper 130 that can be moved relative to the return air opening 112 (FIG. 3) by rotating the damper 130 within the housing 102 (FIG. 3). Accordingly, the damper 130 be moved between a fully closed position and a fully open position, and through intermediate positions therebetween.

When the damper 130 is in the fully closed position, the damper opening 132 is fully out of alignment with the return air opening 112, such that the damper 130 substantially blocks the entire return air opening 112 and prevents the heated return air from entering the mixing area 116 (FIG. 3). Accordingly, when the damper 130 is in fully closed position, the heated return air has little to no effect if any on changing the air temperature within the mixing area 116.

When the damper 130 is in the fully open position, the damper opening 132 is fully aligned with the return air opening 112, such that the heated return air is free to flow through the entire damper opening 132 and/or the return air opening 112 for maximum flow of the heated return air into the mixing area. Accordingly, the damper 130 does not block the return air opening 112 and allows the maximum amount of heated return air to enter the mixing area 116 and mix with the ambient air. As a result, the heated return air has a maximum effect on increasing the air temperature within the mixing area 116 before the air flows into the server room 12 (FIG. 1). The damper 130 can be rotated to a selected intermediate position to control the amount of overlap between the damper opening 132 and the return air opening 112 to control the amount of heated return air that flows into the mixing area 116, thereby controlling the temperature change to the ambient air within the mixing area before the air flows into the server room 12 (FIG. 1).

In the embodiment of the damper 130 shown in FIG. 4A, the damper opening 132 is defined to two long edges 134*a* and 134*b* extending between short upper and lower edges 136 extending along a portion of the damper's circumference. In the illustrated embodiment, at least one of the long edges 134*b* extends along a spiral or helical path relative to the damper's longitudinal axis, such that the width of the damper opening changes along the length of the opening between upper and lower edges 136. This asymmetric damper opening 132 allows for better control of the amount of opening overlap between the damper opening 132 and the return air opening 112 (FIG. 3) to better control the amount of heated return air passing into the mixing chamber 116 (FIG. 3) and the resulting temperature change to the cooled air before the mixture flows through the mixed air outlet 124 (FIG. 3) and toward the server room 12 (FIG. 1). The damper 130 in other embodiments can have one or more other damper openings with different configurations to carefully control the amount of heated return air that can flow into the mixing area and change the temperature of the ambient air.

Figure 4B:
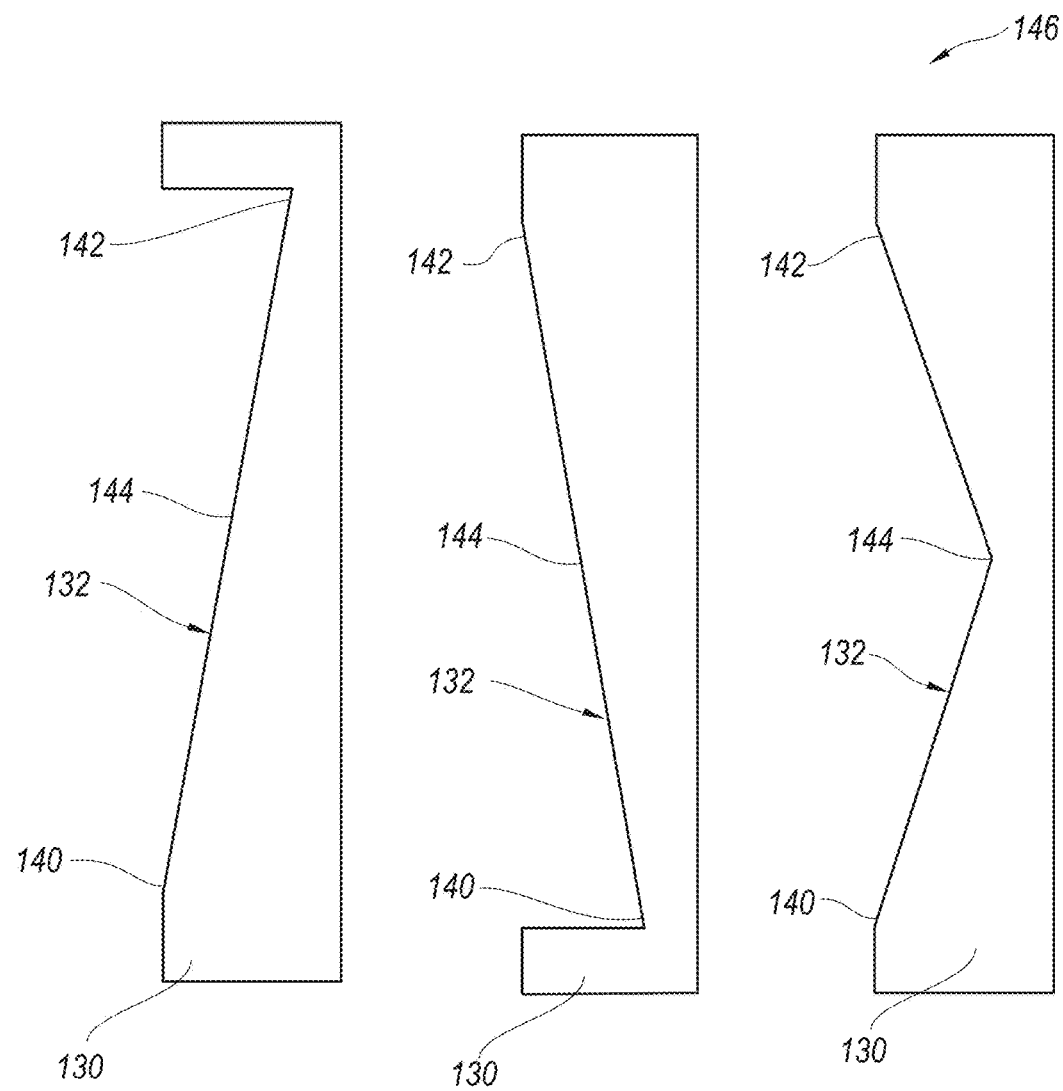
FIG. 4B are side elevation views of airflow dampers with different opening configurations.
Figure 4C:
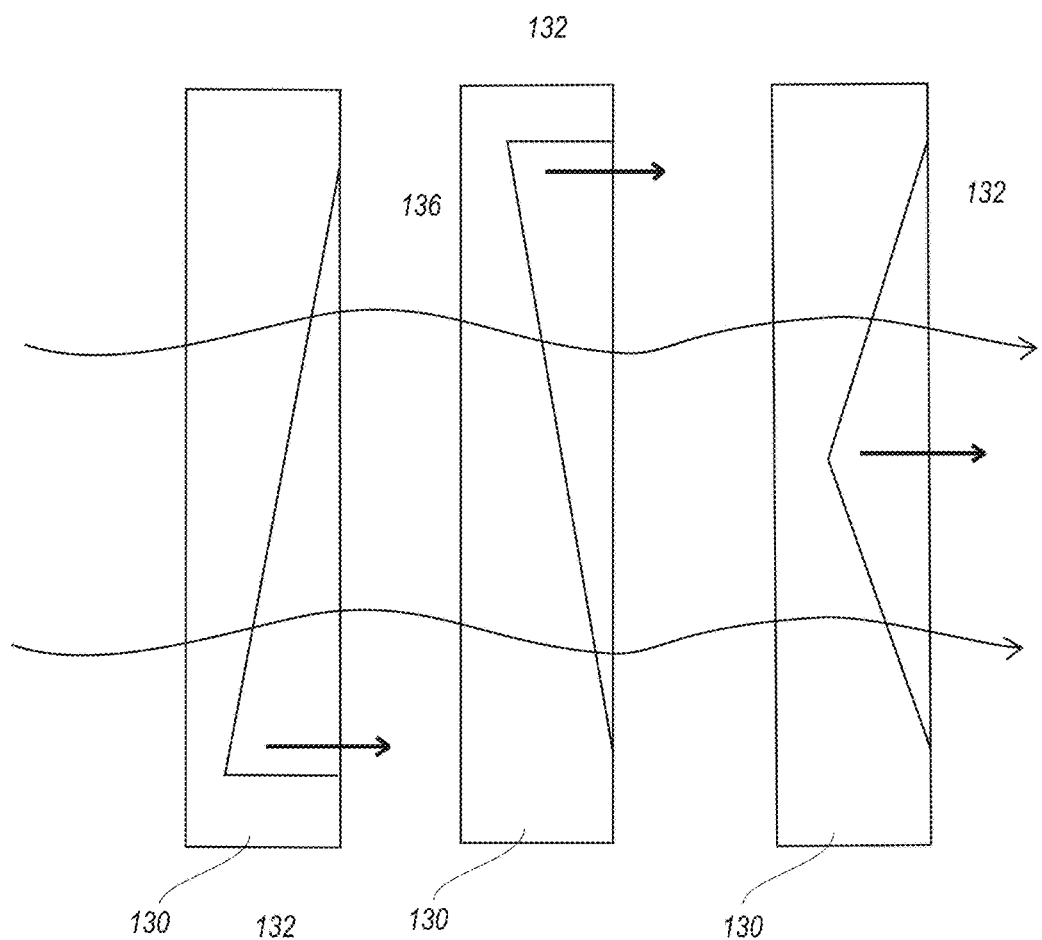
FIG. 4C is a schematic side elevation view of airflow through the airflow dampers of FIG. 4B.

The damper 130 illustrated in FIG. 4A is configured so the opening 132 is larger at one end (i.e., the bottom end 140). In other embodiments illustrated in FIG. 4B, the opening 132 of the damper 130 can have a larger opening 132 at the other end (i.e., the top end 142), or at a middle portion 144 between the top and bottom ends 142 and 140. These dampers 130 with different opening configurations can each be used in air distribution assemblies 100 in an array of assemblies 146, as indicated in FIG. 4C, to provide selected control of the airflow at different positions along the array. This configuration allows for very detailed and accurate control and distribution adjustment of the temperature controlled, mixed cooling air to be delivered downstream and into the server room 12 (FIG. 1).

Figure 5:
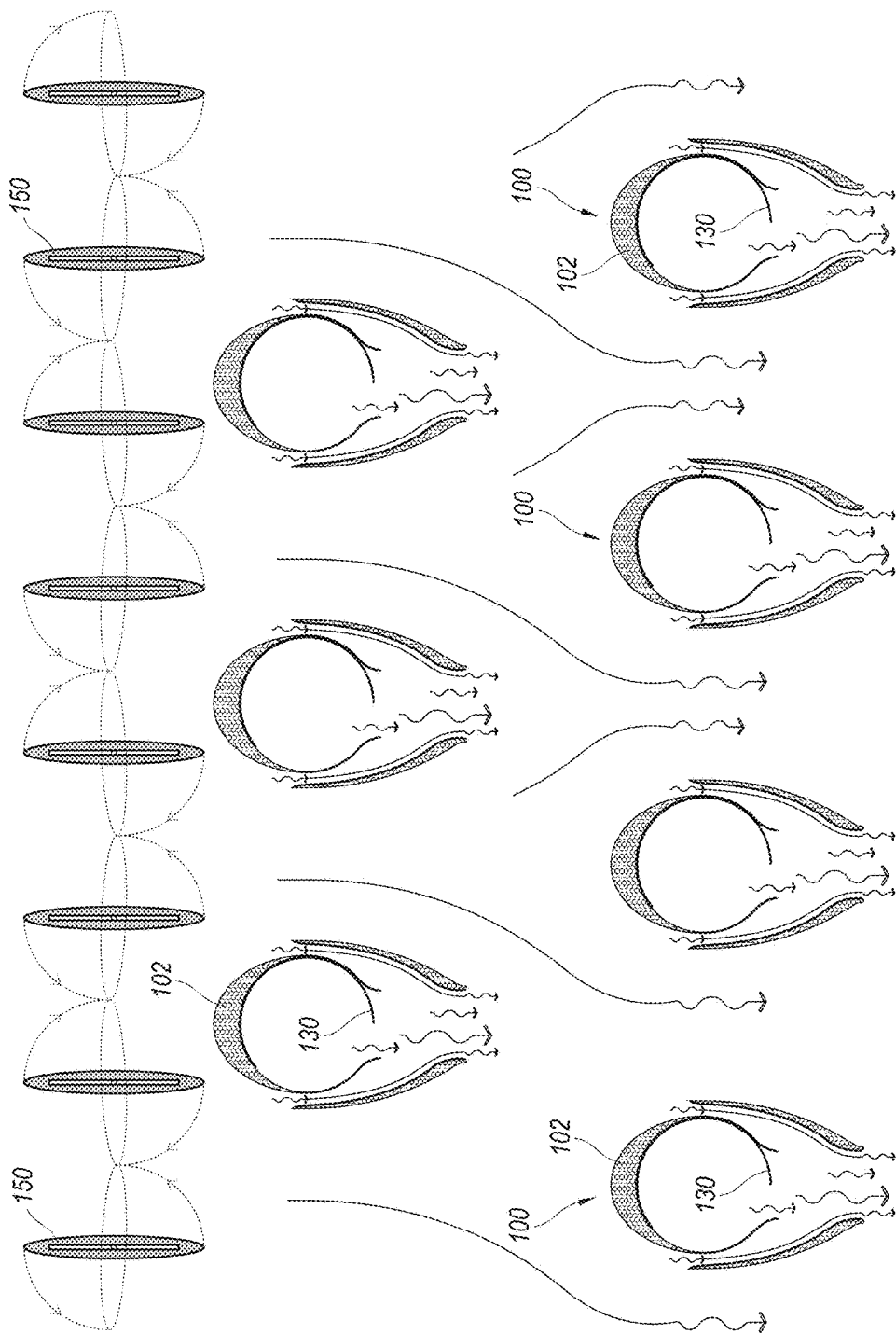
FIG. 5 is a schematic cross-sectional view of a plurality of air distribution assemblies directing mixed, cooling air downstream for delivery into a server room.

The discussion above in connection with FIGS. 2-4A refer to a single air distribution assembly 100. The penthouse cooling system 10 in the data center 14 of FIG. 1 can have a plurality of air distribution assemblies 100 positioned adjacent to the fans and the openings in the floor structure. The air distribution assemblies 100 can be arranged linearly in a single row of assemblies, or in multiple rows. FIG. 5 is a schematic cross-sectional view of a plurality of air distribution assemblies 100 arranged in two offset rows. Other embodiments can have desired additional rows of the distribution assemblies 100 in selected positions for the performance. In the illustrated embodiment, the mixed airflows from an upper row of air distribution assemblies 100 is directed to spaces between the air distribution assemblies 100 in a lower row. The air distribution assemblies 100 in this arrangement may all use the same or different damper configurations and the same or different rotational positions of the dampers 130 within the housing for a desired resulting temperature of the air mixture exiting the air distribution assemblies 100. Alternatively, some or all of the air distribution assemblies 100 can use different positions of the dampers 130 in the housings 102 to provide very tuned control of the overall temperature of the airflow into the server room 12 (FIG. 1) to keep the servers 16 (FIG. 1) adequately cool during operation.

The air distribution assemblies 100 in the array 146 can be positioned relative to each other to abate propagation of noise from the fans (FIG. 1) through the array 146 of assemblies, thereby substantively reducing the noise exiting the penthouse cooling system 10 and the data center 14. In another embodiment, the array 146 of the air distribution assemblies 100 can be combined with a plurality of noise attenuation structures, such as louvered noise attenuation members 150 positioned upstream of the air distribution assemblies 100 to interrupt noise propagation past the array 146 and out of the data center. The louvered noise attenuation members 150 may be adjustable or retained in a fixed position. Additional louvered noise attenuation members 150, or other noise attenuation structures can be used with the array in positions so as to not adversely impact the cooling airflow, while reducing the noise from the penthouse cooling system 10.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

I claim:

1. An air distribution assembly for a server room cooling system, comprising:
   an adjustable return air duct assembly configured to receive heated return air from the server room, wherein the return air duct assembly has:
      a tubular housing with a leading edge portion connected to sidewalls, wherein each of the sidewalls has a trailing edge portion spaced apart from another trailing edge portion and the sidewalls define a return air opening in communication with an interior area of the housing configured to carry the heated return air; and
      an airflow damper being positioned within the housing and moveable relative to the return air opening to block at least a portion of the return air opening and control a flow of the heated return air from the interior area through the return air opening; and
   a pair of spaced apart, arcuate cooling air deflectors positioned on opposing sides of the housing and defining a mixing area, wherein the mixing area is between the deflectors and adjacent to the return air opening, the deflectors having leading end portions spaced apart from the sidewalls of the housing to define cooling air inlets configured to receive cooled air from the server room cooling system that flows around the leading edge portion of the housing and to direct the cooled air into the mixing area, the cooling air deflectors having trailing end portions spaced apart from each other and defining a mixed air outlet in communication with the mixing area and configured to direct a mixture of the cooled air and the heated return air into the server room;
   wherein the airflow damper is adjustable relative to the housing to control a temperature of the mixture of the cooled air and the heated return air directed into the server room.

2. The air distribution assembly of claim 1 wherein the airflow damper is concentrically positioned and rotatable within the housing relative to the return air opening.

3. The air distribution assembly of claim 1 wherein the airflow damper is a cylindrical member coaxially aligned with the housing and positioned within the interior area, the airflow damper has an elongated damper opening with a variable width along the airflow damper's length.

4. The air distribution assembly of claim 1 wherein the trailing edge portions of the housing are flared toward the mixing area.

5. The air distribution assembly of claim 1 wherein the trailing edge portions of the housing are configured to provide at least partially turbulent airflow of the return air into the mixing area.

6. The air distribution assembly of claim 1 wherein the trailing edge portions of the cooling air deflectors are configured to provide at least partially turbulent airflow of the mixed air away from the mixing area toward the server room.

7. The air distribution assembly of claim 1 wherein the leading edge portion of the housing has a noise abating construction to abate noise from the server room cooling system.

8. The air distribution assembly of claim 7 wherein the noise abating construction comprises a plurality of perforations situated on the leading edge portion of the housing, wherein the plurality of perforations are configured to abate the noise.

9. The air distribution assembly of claim 1 wherein the cooling air deflectors each have a plurality of perforations over which air flows to abate noise from the server room.

10. An air distribution assembly, comprising:
    an interior air duct assembly having a housing with an interior area, a leading edge portion, and spaced apart trailing edge portions, the spaced apart trailing edge portions defining an airflow opening in communication with the interior area, the interior air duct assembly having an airflow damper positioned within the housing and moveable relative to the airflow opening to control a flow of heated air out of the interior area through the airflow opening; and
    deflectors positioned on opposing sides of the housing and defining a mixing area between the deflectors and adjacent to the airflow opening, the deflectors having leading end portions spaced apart from the housing to define air inlets configured to receive an airflow around a portion of the housing and into the mixing area, the deflectors having trailing end portions spaced apart from each other and defining a mixed air outlet in communication with the mixing area and configured to direct a mixture of the airflow and a portion of the flow of the heated air away from the mixed air outlet;
    wherein the airflow damper is adjustable relative to the housing to control a temperature of the mixture of the airflow and a portion of the flow of the heated air passing through the mixed air outlet.

11. The air distribution assembly of claim 10 wherein the airflow damper is concentrically positioned and rotatable within the housing relative to the airflow opening.

12. The air distribution assembly of claim 10 wherein the airflow damper is a cylindrical member coaxially aligned with the housing and positioned within the interior area, the airflow damper has an elongated damper opening with an edge of the damper opening that extends along a partial spiral path.

13. The air distribution assembly of claim 10 wherein the trailing edge portions of the housing are configured to provide at least partially turbulent airflow of the heated air into the mixing area.

14. The air distribution assembly of claim 10 wherein the trailing edge portions of the deflectors are configured to provide at least partially turbulent airflow of the mixed air away from the mixing area.

15. The air distribution assembly of claim 10 wherein at least one or more of the leading edge portion and the deflectors has a noise abating construction.

16. The air distribution assembly of claim 15 wherein the noise abating construction comprises a plurality of perforations situated on the deflectors, wherein the plurality of perforations are configured to abate noise from a server room.

17. The air distribution assembly of claim 10 wherein at least one or more of the leading edge portions and the deflectors has a noise abating construction.

18. The air distribution assembly of claim 11 wherein the trailing edge portions of the housing are configured to provide at least partially turbulent airflow of the heated air into the mixing area, and the trailing edge portions of the deflectors are configured to provide at least partially turbulent airflow of the mixed air away from the mixing area.

19. An air distribution assembly for a server room cooling system, comprising:
    an adjustable return air duct assembly configured to receive heated return air from a server room, wherein the return air duct assembly has an elongated housing with a closed leading edge portion and arcuate sidewalls, the arcuate sidewalls having spaced apart trailing edge portions defining a return air opening opposite the closed leading edge portion and in communication with an interior area of a housing through which the heated return air from the server room flows, the return air duct assembly having an airflow damper concentrically positioned within the housing and moveable relative to the return air opening to partially or fully block the return air opening and control a heated return airflow out of the housing through the return air opening; and a pair of spaced apart, arcuate cooling air deflectors positioned on opposing sides of the housing and defining a mixing area between the deflectors and adjacent to the return air opening, the cooling air deflectors having leading end portions spaced apart from the sidewalls of the housing to define cool air inlets configured to receive cooled air flowing around the closed leading edge portion of the housing and to direct the cooled air into the mixing area to mix with the heated return airflow exiting the housing through the return air opening, the cooling air deflectors having a pair of spaced apart trailing end portions defining a mixed air outlet in communication with the mixing area and configured to direct a mixture of the cooled air and the heated return air into the server room;

wherein the airflow damper is adjustable relative to the housing to control an amount of heated return air entering the mixing area to mix with the cooled air to control a temperature of the mixture of the cooled air and the heated return air directed into the server room.

20. The air distribution assembly of claim 19 wherein the housing is a tubular housing and the airflow damper is a cylindrical member coaxially aligned with the housing and positioned within the interior area, the airflow damper has an elongated damper opening with an edge of the damper opening that extends along a partial spiral path.

* * * * *